(12) United States Patent
Huang et al.

(10) Patent No.: US 10,777,281 B2
(45) Date of Patent: *Sep. 15, 2020

(54) ASYMMETRICAL MULTI-GATE STRING DRIVER FOR MEMORY DEVICE

(71) Applicant: Micron Technology, Inc., Boise, ID (US)

(72) Inventors: Guangyu Huang, Boise, ID (US); Haitao Liu, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,874

(22) Filed: Dec. 20, 2018

(65) Prior Publication Data

US 2019/0122737 A1 Apr. 25, 2019

Related U.S. Application Data

(63) Continuation of application No. 15/692,712, filed on Aug. 31, 2017, now Pat. No. 10,170,194.

(51) Int. Cl.
*G11C 16/04* (2006.01)
*G11C 16/26* (2006.01)
(Continued)

(52) U.S. Cl.
CPC ............ *G11C 16/26* (2013.01); *G11C 7/1096* (2013.01); *G11C 16/0483* (2013.01);
(Continued)

(58) Field of Classification Search
CPC ... G11C 16/26; G11C 7/1096; G11C 16/0483; G11C 16/10; G11C 16/16;
(Continued)

(56) References Cited

U.S. PATENT DOCUMENTS 9,780,110 B2 10/2017 Tanzawa et al.
9,916,901 B1 * 3/2018 Saito ...................... G11C 16/26
(Continued)

OTHER PUBLICATIONS

"U.S. Appl. No. 15/692,712, Non Final Office Action dated Jun. 14, 2018", 8 pgs.
(Continued)

*Primary Examiner* — Huan Hoang
(74) *Attorney, Agent, or Firm* — Schwegman Lundberg & Woessner, P.A.

(57) ABSTRACT

Some embodiments include apparatuses, and methods of operating the apparatuses. Some of the apparatuses include a first group of conductive materials interleaved with a first group of dielectric materials, a first pillar extending through the first group of conductive materials and the first group of dielectric materials, memory cells located along the first pillar, a conductive contact coupled to one of the conductive materials, and a second pillar extending through a second group of conductive materials and a second group of dielectric materials. The second pillar includes a first portion coupled to a conductive region, a second portion, and a third portion, and a fourth portion coupled to the conductive contact. The second portion is located between the first and third portions. The second portion has a doping concentration less than a doping concentration of each of the first and fourth portions.

20 Claims, 8 Drawing Sheets

(51) Int. Cl.
*G11C 16/10* (2006.01)
*H01L 27/11524* (2017.01)
*H01L 27/11573* (2017.01)
*H01L 27/11556* (2017.01)
*H01L 27/11582* (2017.01)
*H01L 27/1157* (2017.01)
*H01L 27/11529* (2017.01)
*G11C 16/16* (2006.01)
*H01L 27/11565* (2017.01)
*H01L 27/11575* (2017.01)
*G11C 7/10* (2006.01)

(52) U.S. Cl.
CPC .............. *G11C 16/10* (2013.01); *G11C 16/16* (2013.01); *H01L 27/1157* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11575* (2013.01); *H01L 27/11582* (2013.01)

(58) Field of Classification Search
CPC ......... H01L 27/11524; H01L 27/11529; H01L 27/11556; H01L 27/11565; H01L 27/1157
USPC .................................................. 365/185.17
See application file for complete search history.

(56) References Cited

U.S. PATENT DOCUMENTS 10,170,194 B1* 1/2019 Huang .................. G11C 16/26
2014/0160841 A1* 6/2014 Koval ............... H01L 29/40114
365/185.01

OTHER PUBLICATIONS

"U.S. Appl. No. 15/692,712, Notice of Allowance dated Sep. 27, 2018", 6 pgs.
"U.S. Appl. No. 15/692,712, Response filed Jul. 31, 2018 to Non-Final Office Action dated Jun. 14, 2018", 9 pgs.

* cited by examiner

U.S. 10,777,281 B2

ASYMMETRICAL MULTI-GATE STRING DRIVER FOR MEMORY DEVICE

BACKGROUND

Memory devices are widely used in computers, cellular phones, and many other electronic items. A conventional memory device, such as a 3D (three-dimensional) flash memory device, has many memory cells to store information. A memory device has conductive lines and circuitry to provide voltages to the conductive lines in order to access the memory cells during different memory operations. Such circuitry often includes drivers (e.g., switches) to pass voltages from a voltage source to respective conductive lines. Some memory operations may use a relatively high voltage (e.g., ten to 20 times the operating voltage of the memory device). Many conventional drivers are designed to sustain such a high voltage. However, some memory devices may use even higher voltage in some of their operations. Such a higher voltage may make some conventional drivers unreliable. Designing drivers to support such a higher voltage may add complexity to peripheral circuitry associated with conventional drivers.

DETAILED DESCRIPTION

Figure 1:
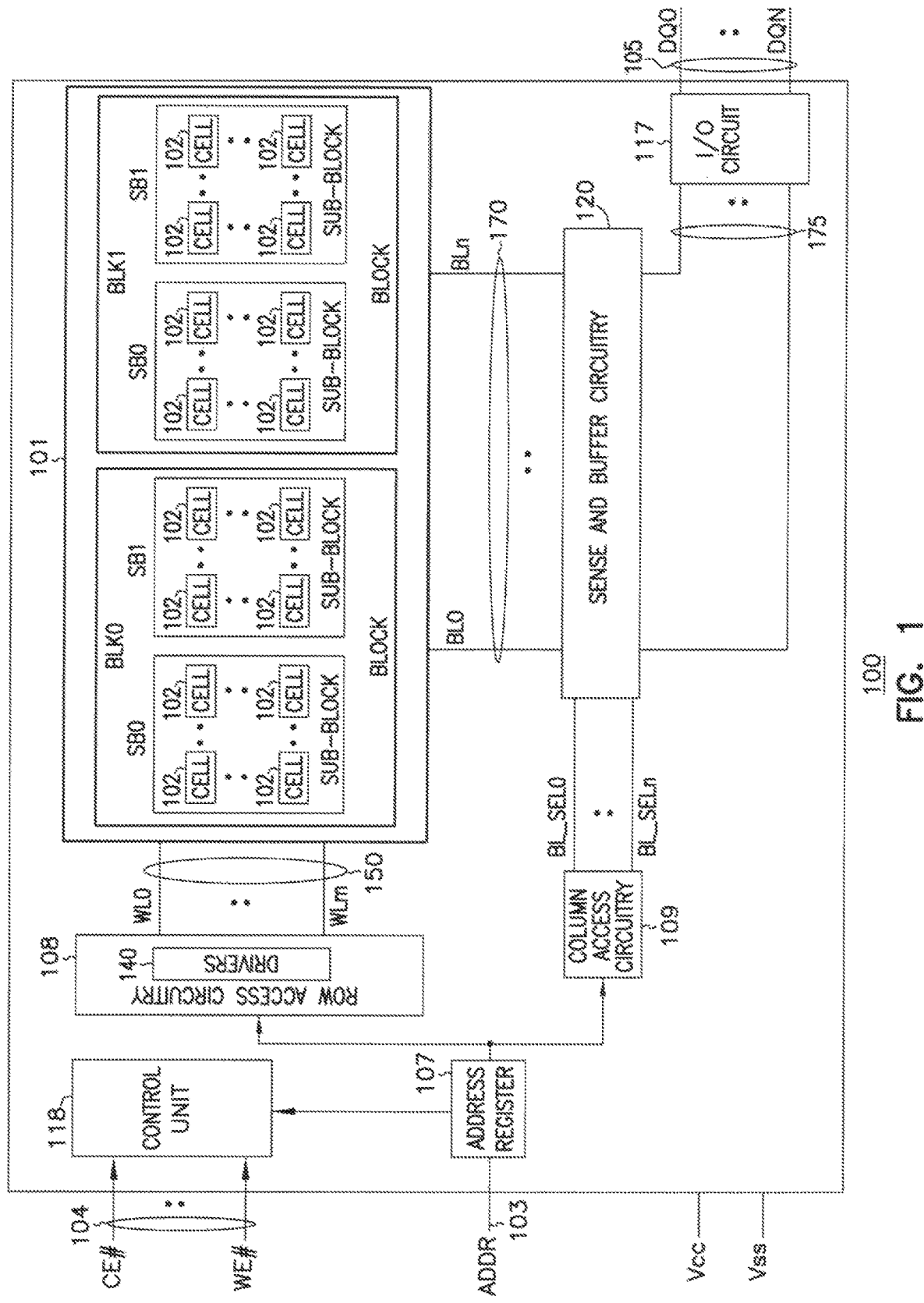
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 and BLK1. Each of blocks BLK0 and BLK1 can include its own sub-blocks, such as sub-blocks SB0 and SB1. In the physical structure of memory device 100, memory cells 102 can be arranged vertically (e.g., stacked over each other) over a substrate (e.g., a semiconductor substrate) of memory device 100. FIG. 1 shows memory device 100 having two blocks BLK0 and BLK1 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 and BLK1 and data lines 170 to selectively exchange information (e.g., data) with memory cells 102 of blocks BLK0 and BLK1.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 and BLK1 are to be accessed during a memory operation. Memory device 100 can include drivers (driver circuits) 140, which can be part of row access circuitry 108. Drivers 140 can include the drivers described in more detail with reference to FIG. 2 through FIG. 8. Drivers 140 can operate (e.g., operate as switches) to form (or not to form) conductive paths (e.g., current paths) between nodes providing voltages and respective access lines 150 during operations of memory device 100.

Memory device 100 can perform a read operation to read (e.g., sense) information (e.g., previously stored information) from memory cells 102 of blocks BLK0 and BLK1, or a write (e.g., programming) operation to store (e.g., program) information in memory cells 102 of blocks BLK0 and BLK1. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 and BLK1.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 and BLK1 and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 and BLK1 (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 and BLK1 and lines (e.g., I/O lines) 105. Signals DQ0 through DQN on lines 105 can represent information read from or stored in memory cells 102 of blocks BLK0 and BLK1. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 8.

Figure 2:
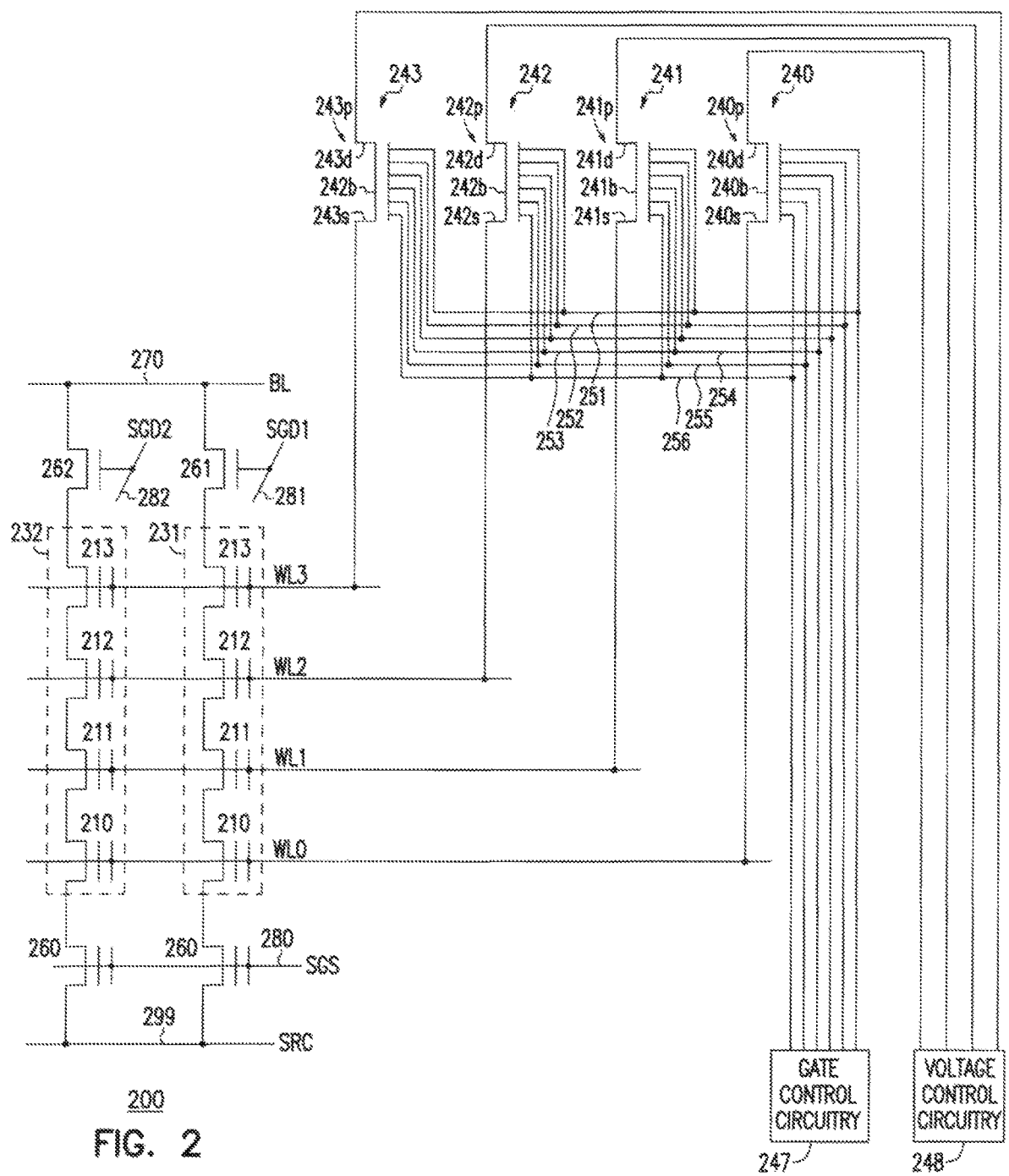
FIG. 2 shows a block diagram of a portion of a memory device including memory cell strings and drivers (e.g., driver circuits), according to some embodiments described herein.

FIG. 2 shows a block diagram of a portion of a memory device 200 including memory cell strings 231 and 232 and drivers (e.g., driver circuits) 240, 241, 242, and 243, according to some embodiments described herein. Memory device 200 can correspond to memory device 100 of FIG. 1. For example, memory cell strings 231 and 232 can be part of a memory array of FIG. 2 that can correspond to memory array 101 of FIG. 1, and drivers 240, 241, 242, and 243 can correspond to drivers 140 of FIG. 1.

Memory device 200 can include a data line 270 that carry a signal (e.g., bit line signal) BL0. Data line 270 can be structured as a conductive line (which includes conductive material). The memory cell strings 231 and 232 can share data line 270. FIG. 2 shows an example of one data line 270 of memory device 200. However, memory device 200 can include numerous data lines.

Memory device 200 can include a line 299 that can carry a signal SRC (e.g., source line signal). Line 299 can be structured as a conductive line (which includes conductive materials) and can form part of a source (e.g., a source line) of memory device 200.

As shown in FIG. 2, memory device 200 can include memory cells 210, 211, 212, and 213; select gates (e.g., drain select gates or transistors) 261 and 262; and select gates (e.g., source select gates or transistors) 260. Memory device 200 can include select lines (e.g., drain select lines) 281 and 282 to control (e.g., turn on or turn off) select gates 261 and 262, respectively, and a select line (e.g., source select line) 280 to control (e.g., turn on or turn off) select gates 260.

Each of memory cell strings 231 and 232 can include one of memory cells 210, one of memory cells 211, one of memory cells 212, and one of memory cells 213. Memory cells 210, 211, 212, and 213 in a respective memory cell string are coupled in series between a respective drain select gate (e.g., select gate 261 or 262) and a respective source select gates (e.g., one of select gates 260).

FIG. 2 shows an example of four memory cells 210, 211, 212, and 213 in each memory cell string. The number of memory cells in each of memory cell strings 231 and 232 can vary. FIG. 2 shows an example of two memory cell strings and associated select gates (e.g., drain and source select gates) coupled between data line 270 and line 299 to help focus on the embodiments described herein. However, memory device 200 can include numerous memory cell strings and their select gates coupled between data line 270 and line 299.

Memory device 200 can include access lines 220, 221, 222, and 223, which can be local access lines (e.g., a group of local word lines) that can carry corresponding signals (e.g., local word line signals) $WL0_0$, $WL1_0$, $WL2_0$, and $WL3_0$.

Memory device 200 can include access lines 220', 221', 222', and 223', which can be global access lines (e.g., a group of global word lines) that can carry corresponding signals (e.g., global word line signals) V0, V1, V2, and V3. Signals V0, V1, V2, and V3 can be provided with different voltages or with the same voltage at a particular time, depending on which operation memory device 200 operates at that particular time.

As shown in FIG. 2, drivers 240, 241, 242, and 243 can be coupled to between respective access lines 220, 221, 222, and 223 and respective access lines 220'. Each of drivers 240, 241, 242, and 243 can operate as a switch that can be turned on (e.g., placed in a conductive state (or on-state))) or turned off (e.g., placed in a non-conductive state (or off-state)). Drivers 240, 241, 242, and 243 can be configured to turn on in order to form conductive paths (e.g., current paths) between respective access lines 220, 221, 222, and 223 and 220', 221', 222', and 223'. For example, drivers 240, 241, 242, and 243 can be turned on during read and write operations of memory device 200 when memory cell string 231 or 232 is selected to store information in or read information from a selected memory cell (or memory cells) of memory cell string 231 or 232, Drivers 240, 241, 242, and 243 can be configured to turn off in order to not form conductive paths (e.g., current paths) between respective access lines 220, 221, 222, and 223 and 220', 221', 222', and 223'. For example, drivers 240, 241, 242, and 243 can be turned off when memory cell string 231 or 232 is not selected to store information in or read information from a selected memory cell (or memory cells) in memory cell string 231 or 232.

As shown in FIG. 2, each of drivers 240, 241, 242, and 243 can include control gates (multiple control gates) 251, 252, 253, 254, 255, and 256. Drivers 240, 241, 242, and 243 can share control gates 251 through 256, such that signals (e.g., control signals or voltages) CG1, CG2, CG3, CG4, CG5, and CG6 (shown in FIG. 3) provided to control gates 251 through 256, respectively, can be used to concurrently control (e.g., simultaneously turn on or simultaneously turn off) drivers 240, 241, 242, and 243. FIG. 2 shows an example where each of drivers 240, 241, 242, and 243 can include six control gates (e.g., 251, 252, 253, 254, 255, and 256). However, the number of control gates can vary. For example, each of drivers 240, 241, 242, and 243 can include only two control gates and two associated signals to control the two control gates. In another example, each of drivers 240, 241, 242, and 243 can include three or more control gates and associated control signals.

As shown in FIG. 2, memory device 200 can include gate control circuitry 247 to provide different sets of voltages to control gates 251 through 256. For example, gate control circuitry 247 can provide a set of voltages to respective signals CG1, CG2, CG3, CG4, CG5, and CG6 (shown in FIG. 3) to concurrently turn on drivers 240, 241, 242, and 243, and another set of voltages to signals CG1, CG2, CG3, CG4, CG5, and CG6 to concurrently turn off drivers 240, 241, 242, and 243.

Drivers 240, 241, 242, and 243 can provide (e.g., drive or pass) signals (e.g., voltages) V0, V1, V2, and V3 from respective access lines 220', 221', 222', and 223' to respective access lines 220, 221, 222, and 223 when drivers 240, 241, 242, and 243 are turned on. Drivers 240, 241, 242, and 243 do not provide signals V0, V1, V2, and V3 to respective access lines 220, 221, 222, and 223 when drivers 240, 241, 242, and 243 are turned off.

Memory device 200 can include voltage control circuitry 248 to control the values of voltages provided by signals V0, V1, V2, and V3 to access lines 220, 221, 222, and 223. The values of voltages provided by signals V0, V1, V2, and V3 can be different from each other during an operation (e.g., read or write operation) of memory device 200. As an example, in a read operation of memory device 200, if memory cell 212 of memory cell string 231 is selected to be read (e.g., to sense information from memory cell 212 of memory cell string 231), then the voltage applied to access line 222 (associated with signal WL2) can have one value (e.g., a value equal to a read voltage Vread (e.g., V2=Vread)), and the value of voltages applied to access lines 220, 221, and 223 can be the same (e.g., V0=V1=V3) but can be different from the value of voltage Vread (e.g., V2<V0, V2, V3). In another example, in a write (e.g., program operation) of memory device 200, if memory cell 212 of memory cell string 231 is selected to store information, then the voltage applied to access line 222 (associated with signal WL2) can have one value (e.g., a value equal to a program voltage Vprg (e.g., V2=Vprg (e.g., 30V)), and the value of voltages applied to access lines 220, 221, and 223 can be the same (e.g., V0=V1=V3) but can be different from the value of voltage V2 (e.g., V2>V0, V1, V3). Thus, the values of voltages provided by signals V0, V1, V2, and V3 to access lines 220, 221, 222, and 223 (through respective pillars 240*p*, 241*p*, 242*p*, and 243*p*) can be different between operations (e.g., between read and write operations) of memory device 200.

During an erase operation of memory device 200 to erase information from memory cell strings 231 and 232, an erase voltage (e.g., Verase of approximately 30V) can be applied to data line 270 and line 299, and access lines 220, 221, 222, and 223 can be applied with zero volts. During an erase operation of memory device 200 to erase information from other memory cell strings that share data line 270 the erase voltage may also be applied to data line 270 and line 299 however, access lines 220, 221, 222, and 223 can be place in a float condition (or alternatively be applied with some voltages (through pillars 240*p*, 241*p*, 242*p*, and 243*p*)).

In the physical structures of drivers 240 (as described in more detail with reference to FIG. 3 through FIG. 8), each of pillars 240*p*, 241*p*, 242*p*, and 243*p* can include different portions coupled between a respective local access line (e.g., one of access lines 220, 221, 222, and 223) and a respective global access line (e.g., one of lines 220' through 223'). For example, as shown in FIG. 2, pillar 240*p* can include portions 240*d*, 240*a*, 240*b*, and 240*s*. Portions 240*d*, 240*a* 240*b*, and 240*s* can be parts of the drain, a lightly doped portion relative to the drain, the body (e.g., channel), and the source, respectively, of pillar 240*p*. In the physical structures of driver 240, it can include a pillar (e.g., a vertical pillar) 240*p* where portions 240*d*, 240*b*, and 240*s* can be portions of pillar 240*p*. In FIG. 2, driver 240 can form a conductive path between access lines 220 and 220' through portions 240*d*, 240*a*, 240*b*, and 240*s* when driver 240 is turned on. Pillar 240*p* does not form a conductive path between access lines 220 and 220' when driver 240 is turned off.

Each of drivers 241 through 243 can include elements (e.g., a pillar and associated portions) similar to the elements of driver 240. For example, driver 241 can include pillar 241*p* that can include portions 241*d*, 241*a*, 241*b*, and 241*s*. Driver 242 can include pillar 242*p* that can include portions 242*d*, 242*a*, 242*b*, and 242*s*. Driver 243 can include pillar 243*p* that can include portions 243*d*, 243*a*, 243*b*, and 243*s*.

Figure 3:
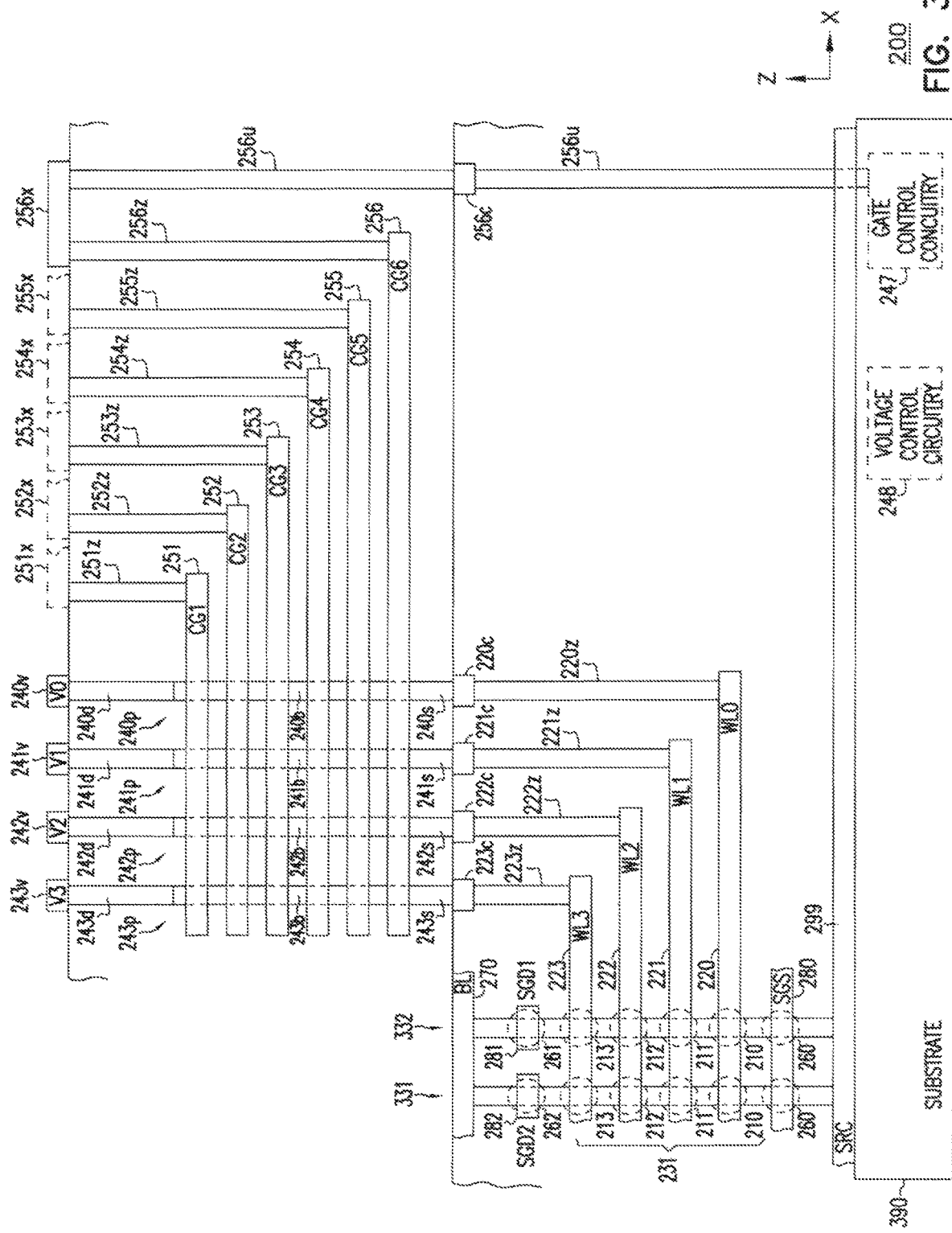
FIG. 3 shows a side view of a structure of a portion of the memory device of FIG. 2, according to some embodiments described herein.

FIG. 3 shows a side view of a structure of a portion of memory device 200, according to some embodiments described herein. The structure of memory device 200 in FIG. 3 corresponds to part of the schematic diagram of memory device 200 shown in FIG. 2. As shown in FIG. 3, memory device 200 can include a substrate 390 over which memory cells 210, 211, 212, and 213 of memory cell strings 231 and 232 can be formed in different levels (internal levels) over substrate 390 (e.g., formed vertically in z-direction with respect to line 299 and substrate 390).

Substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type).

Gate control circuitry 247 and voltage control circuitry 248 can be formed in substrate 390. Although not shown in FIG. 3, substrate 390 can include circuitry (that can be located under line 299). Such circuitry can include sense amplifiers, buffers (e.g., page buffers), decoders, and other circuit components of memory device 200.

As shown in FIG. 3, data line 270 can have a length extending in the x-direction, which is perpendicular to the z-direction. Data line 270 can include a conductive material (e.g., conductively doped polycrystalline silicon (doped polysilicon), metals, or other conductive materials). Line 299 can include a conductive material and can have a length extending in the x-direction. FIG. 3 shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390). In another alternative structure of memory device 200, line 299 can be form over a dielectric material (e.g., an oxide material over substrate 390).

Select line (e.g., drain select line) 281 and 282 can be located in a level between data line 270 and memory cell strings 231 and 232. Select line (e.g., source select line) 280 can be located in a level between memory cell strings 231 and 232 and line 299 (and substrate 390).

Memory cells 210, 211, 212, and 213 of memory cell strings 231 and 232 can be located in respective levels between the level of select lines 281 and 282 and the level of select line 280. Access lines 220, 221, 222, and 223 (associated with memory cells 210, 211, 212, and 213, respectively) can be located in the same levels as memory cells 210, 211, 212, and 213, respectively.

Access lines 220, 221, 222, and 223 can include conductive materials (a group of conductive materials), which can include conductively doped polysilicon, metals, or other conductive materials. Memory device 200 can include dielectric materials (e.g., not labeled), interleaved with (located in the spaces between) access lines 220, 221, 222, and 223. Examples of such dielectric materials include silicon dioxide. The materials of select lines 280, 281, and 282 can include conductively doped polysilicon, metals, or other conductive materials and can be the same as the conductive material of access lines 220, 221, 222, and 223.

As shown in FIG. 3, memory device 200 can include pillars (memory cell pillars) 331 and 332. Each of pillars 331 and 332 can have length extending in the z-direction (e.g., extending vertically with respect to substrate 390) through access lines 220, 221, 222, and 223 and through the dielectric materials (e.g., silicon dioxide) that are interleaved with access lines 220, 221, 222, and 223. Each of pillars 331 and 332 can contact a conductive region of the material that forms part of data line 270 and contact a conductive region of the material that forms part of line 299.

Each of pillars 331 and 332 can include a material (or materials) to form a conductive path (e.g., a current path) between data line 270 and line 299. Such a material (e.g., undoped or doped polysilicon) of each of pillars 331 and 332 can be part of a channel (not shown in FIG. 3) of a respective pillar among pillars 331 and 332.

For simplicity, FIG. 3 omits detailed structures of memory cells 210, 211, 212, and 213. However, memory cells 210, 211, 212, and 213 can include structures of a 3D NAND memory device or other non-volatile memory devices. For example, memory cells 210, 211, 212, and 213 can include a TANOS (TaN, $Al_2O_3$, $Si_3N_4$, $SiO_2$, Si) structure, a SONOS (Si, $SiO_2$, $Si_3N_4$, $SiO_2$, Si) structure, a floating gate structure, or other memory cell structures.

Each of select gates 260, 261, and 262 can operate as a switch (e.g., a field-effect transistor (FET) structure. Thus, each of select gates 260, 261, and 262 can have a structure of a FET. Alternatively, each of select gates 260, 261, and 262 can have the same structure (e.g., TANOS, SONOS, or floating gate structure) as memory cells 210, 211, 212, and 213.

As shown in FIG. 3, each of select lines 280, 281, and 282 is a piece (e.g., a single layer) of conductive material (e.g., polysilicon, metal, or other conductive materials). A select line (e.g., select line 280, 281, or 282) can carry a signal (e.g., signal SGD1, SDG2, or SGS) but it does not operate like a switch (e.g., a transistor). A select gate (e.g., select gate 260, 261, and 262) can include a portion of a respective select line (e.g., a portion of the piece of the conductive material that forms the respective select line) and additional structures to perform a function (e.g., function of a transistor). For example, each of select gate 260 can include a portion of select line 280 and a portion of a structure (not shown) along pillar 331 adjacent select line 280; select gate 261 can include a portion of select line 281 and a portion of a structure (not shown) along pillar 331 adjacent select line 281; and select gate 262 can include a portion of select line 282 and a portion of a structure (not shown) along pillar 332 adjacent select line 282.

Memory device 200 can include conductive segments 220z, 221z, 222z, and 223z (e.g., vertical segments extending in the z-direction) and contacting respective access lines 220, 221, 222, and 223 and respective conductive contacts 220c, 221c, 222c, and 223c. Pillars 240p, 241p, 242p, and 243p of respective drivers 240, 241, 242, and 243 can be coupled to respective access lines 220, 221, 222, and 223 through respective conductive contacts 220c, 221c, 222c, and 223c and respective conductive segments 220z, 221z, 222z, and 223z.

As shown in FIG. 3, control gate 251 through 256 of respective drivers 240, 241, 242, and 243 can be located in different levels of memory device 200 over (above) the levels where memory cells 210, 211, 212, and 213 are located. Control gates 251 through 256 can include conductive materials (a group of conductive materials), which can include conductively doped polysilicon (e.g., n-type or p-type polysilicon), metals, or other conductive materials. Memory device 200 can include dielectric materials (e.g., not labeled), interleaved with (located in the spaces between) control gates 251 through 256. Examples of such dielectric materials include silicon dioxide.

Each of pillars 240p, 241p, 242p, and 243p can have length extending in the z-direction (e.g., extending vertically with respect to substrate 390) through control gates 251 through 256 and through the dielectric materials (e.g., silicon dioxide) that are interleaved with control gates 251 through 256.

Memory device 200 can include conductive regions 240v, 241v, 242v, and 243v that can be parts of conductive materials (e.g., conductively doped polysilicon, metal, or other conductive materials) that form parts of respective access lines (e.g., global access lines) 220', 221', 222', and 223'. Although not shown in FIG. 3, memory device 200 can include conductive connections (which can be part of access lines 220', 221', 222', and 223') that can be formed to provide electrical connections between respective pillars 240p, 241p, 242p, and 243p and voltage control circuitry 248. As described above with reference to FIG. 2, voltage control circuitry 248 (e.g., formed in substrate 390 of FIG. 3) can operate to apply different voltages to access lines 220, 221, 222, and 223 (through respective pillars 240p, 241p, 242p, and 243p when drivers 240 through 243 are turned on (e.g., concurrently turned on)).

As shown in FIG. 3, each of pillars 240p, 241p, 242p, and 243p can be located between (and can contact) a respective conductive region among conductive regions 240v, 241v, 242v, and 243v and a respective conductive contact among conductive contacts 220c, 221c, 222c, and 223c. For example, as shown in FIG. 3, pillar 240p can be located between conductive region 240v and conductive contact 220c, in which portion 240d contacts (e.g., directly coupled to) conductive region 240v, and portion 240s of pillar 240p contacts (e.g., directly coupled to) conductive contact 220c. Similarly, each of pillars 241p, 242p, and 243p can have respective portion 240d contacting a respective conductive region (among respective conductive regions 241v, 242v, and 243v) and a respective portion 240s contacting a respective conductive contact (among conductive contacts 221c, 222c, and 223c).

Memory device 200 can include connections (conductive connections that can include conductive segments 251z through 256z, 251x through 256x, and 256u) to form conductive paths between control gates 251 through 256 and gate control circuitry 247. For example, memory device 200 can include a conductive connection (between control gate 256 and gate control circuitry 247) that can include conductive segments 256z (e.g., vertical segment in the z-direction), 256x (e.g., horizontal segment in the x-direction, and 256u (e.g., vertical segments in the z-direction). Other connections between control gates 251 through 255 are shown in FIG. 3. Memory device 200 can include conductive segments 251z through 255z (hidden from the view of FIG. 3), which are similar to conductive segment 256z, coupled to respective control gates 251 through 255.

FIG. 3 shows example structures (e.g., a staircase structure at edges) of control gates 251 through 256. However, in an alternative structure of memory device 200, control gates 251 through 256 may have other structures as long as conductive connections (e.g., connections similar to connections formed by conductive segments 251z through 256z, 251x through 256x, and 256u) can be formed to provide electrical connections between respective control gates 251 through 256 and gate control circuitry 247. Moreover, FIG. 3 shows an example where control gates 251 through 256 are located above memory cells 210, 211, 212, and 213 (and above access lines 220, 221, 222, and 223). However, control gates 251 through 256 can be located below memory cells 210, 211, 212, and 213. Further, FIG. 3 shows an example where pillars 240p, 241p, 242p, and 243p of drivers 240 through 243 are vertically located (e.g., having a length in the z-direction) above memory cells 210, 211, 212, and 213. In an alternative structure of memory device 200, pillars 240p, 241p, 242p, and 243p can be horizontally located (e.g., having a length in the x-direction or y-direction) in memory device 200.

Figure 4:
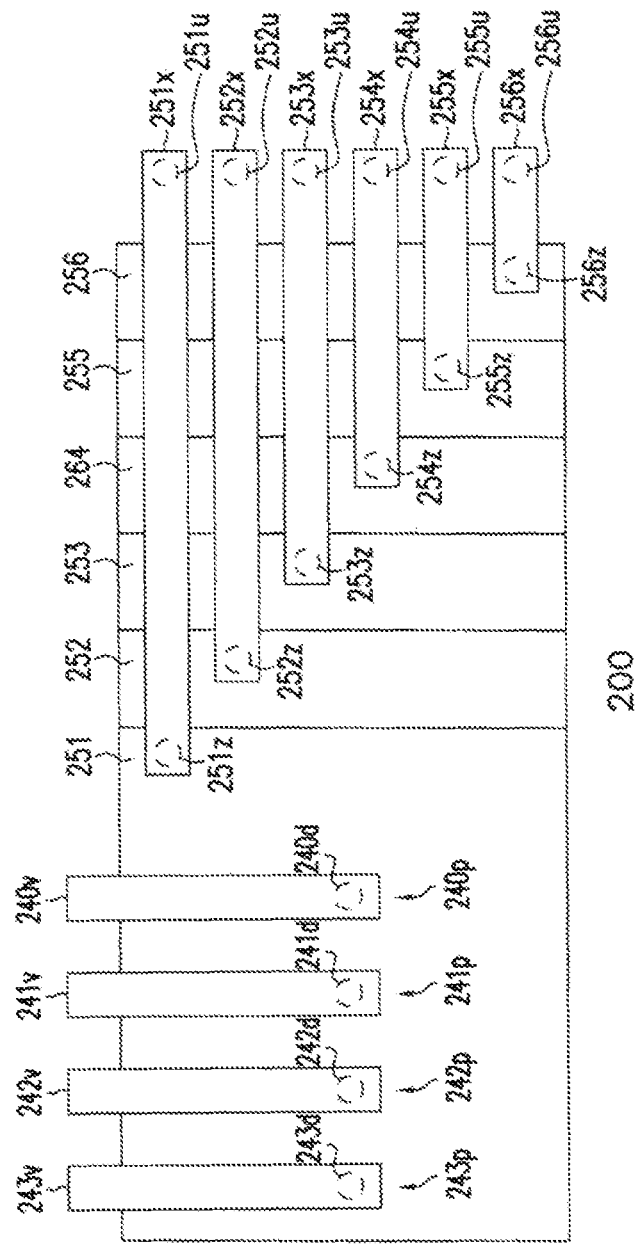
FIG. 4 shows a top view of a structure of the portion of the memory device of FIG. 3, according to some embodiments described herein.

FIG. 4 shows a top view of a structure of the portion of memory device 200 including the portion shown in FIG. 3, according to some embodiments described herein. FIG. 4 shows example structures and routing paths of connections (e.g., connections including conductive segments 251z through 256z, 251x through 256x, and 251z through 256u) associated with drivers 240, 241, 242, and 243. However, in an alternative structure of memory device 200, the structures and routing paths of connections associated with drivers 240, 241, 242, and 243 can be different from those shown in FIG. 3 and FIG. 4.

As shown in FIG. 4, pillars 240p, 241p, 242p, and 243p (and associated portions 240d, 241d, 242d, and 243d) can be separated from each other in the x-direction. Conductive regions 240v, 241v, 242v, and 243v (contacting respective portions 240d, 241d, 242d, and 243d) can be parts of respective conductive materials (e.g., conductive lines) that can extend in the y-direction. Conductive segments 251z through 256z (coupled to respective control gates 251 through 256) can be arranged in the x-direction and y-direction as shown in FIG. 4. Conductive segment 251x through 256x can be part of respective conductive materials that can extend in the x-direction, which is perpendicular to the y-direction. Conductive segments 251u through 256u (underneath respective conductive segments 251z through 256z) can be spaced apart in the y-direction. FIG. 3 and FIG. 4 shows each of drivers 240, 241, 242, and 243 includes one pillar (e.g., one of pillars 240p, 241p, 242p, and 243p). However, each of drivers 240, 241, 242, and 243 can include multiple pillars.

Figure 5:
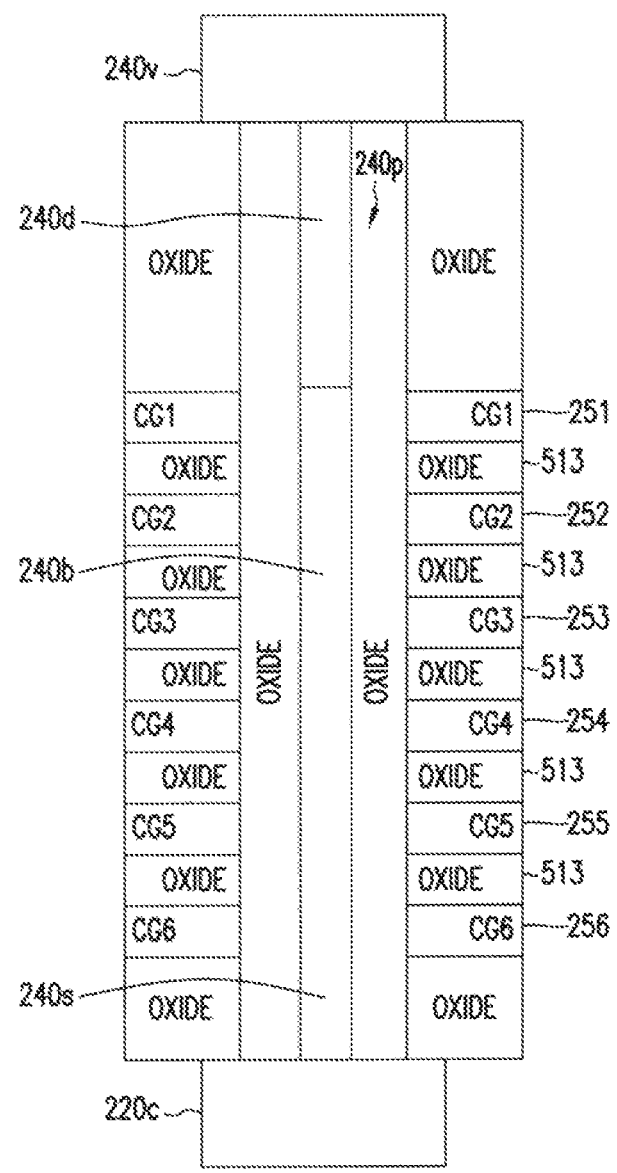
FIG. 5 shows a structure of a portion of a driver of the memory device of FIG. 2, FIG. 3, and FIG. 4, according to some embodiments described herein.

FIG. 5 shows a structure of a portion of driver 240 of memory device 200 of FIG. 2, FIG. 3, and FIG. 4, according to some embodiments described herein. For simplicity, only one of the drivers (e.g., driver 240) of memory device 200 is described in detail in this description. Each of other drivers 241, 242, and 243 has a structure similar to the structure of driver 240 shown in FIG. 4.

As shown in FIG. 5, control gates 251 through 256 (e.g., a group of conductive materials that form control gates 251 through 256) can be interleaved with a group of dielectric materials 513 (oxide materials are shown as an example for dielectric materials 513). Pillar 240p can contact conductive region 240v and conductive contact 223c at portions 240d and 240s, respectively.

Driver 240 can include dielectric material 513 between pillar 240p and control gates 251 through 256 and surrounding pillar 240p. Driver 240 can also include additional dielectric material (e.g., silicon dioxide) material surrounding portion 240d, and additional dielectric material (e.g., silicon dioxide) surrounding portion 240s. As shown in FIG. 5, portion 240d can contact conductive region 240v, and portion 240s can contact conductive contact 220c.

FIG. 5 (and in FIG. 6, FIG. 7, and FIG. 8) shows an example where the dielectric material between pillar 240p and control gates 251 through 256 being an oxide material (e.g., silicon dioxide (gate oxide)). However, the dielectric material between pillar 240p and control gates 251 through 256 can be different from silicon dioxide material. Examples of such dielectric material include high-k materials (materials having a dielectric constant higher than the dielectric constant of silicon dioxide, e.g., nitride, AlO, HfO, ZrO and other high-K materials). Alternatively, the dielectric material between pillar 240p and control gates 251 through 256 can be a combination of high-K materials and silicon dioxide material.

Pillar 240p can be asymmetrically configured, such that portions 240d, 240a, 240b, and 240s can have the same material (e.g., polysilicon) but different doping concentration. The asymmetrical properties of pillar 240p can enhance operations of driver 240 and allow driver 240 to have improvements over some conventional drivers, as further discussed below.

In FIG. 5, portion 240a can have a doping concentration less than (e.g., 10 to 40 times less than) the doping concentration of each of portions 240d and 240s. Portion 240b can be undoped or doped polysilicon. Portion 240b can have a doping concentration less than or close to (e.g., equal to) the doping concentration of portion 240a if portion 240b is doped.

As an example, portions 240d, 240a, and 240s be polysilicon doped with impurities (e.g., dopants) in which portion 240d can have a doping concentration in the range of $xe19$ to $xe21$ per $cm^3$ (where x is a number greater than zero and less than 10), portion 240a can have a doping concentration in the range of $xe17$ to $xe18$ per $cm^3$, and portion 240s can have a doping concentration in the range of $xe19$ to $xe21$ per $cm^3$. In this example, portion 240b can have a doping concentration close to (e.g., equal to) or less than the doping concentration of portion 240a, or alternatively, portion 240b can be undoped polysilicon.

As shown in FIG. 5, portion 240d has a vertical dimension (e.g., a length in the z-direction between conductive region 240v and portion 240a). Portion 240a has a vertical dimension (e.g., a length in the z-direction between portion 240d and 240b). The vertical dimension of portion 240a can be greater than the vertical dimension of portion 240d.

Portion 240a can be formed by deposition, such that the material (e.g., lightly doped polysilicon) of portion 240a can have a grain size of approximately 10 nm (nanometers) to 20 nm. In an alternative structure of memory device 200, portion 210a can be formed by techniques such as metal-induced crystallization, laser anneal, or low-temperature anneal. In such an alternative structure, portion 240a can include a material (e.g., a silicon-like material), in which such a material can have a grain size of approximately greater than 150 nm (e.g., a grain size of approximately 200 nm, which can be at least 10 times the grain size of a typical lightly doped polysilicon).

As described above with referenced to FIG. 2 through FIG. 5, driver 240 can be turned on (e.g., can be placed in an on-state) to form a conductive path through pillar 240p. Driver 240 can be turned off (e.g., can be placed in an off-state) to not form a conductive path through pillar 240p. A relatively high voltage (e.g., V5=30V) can be applied to each of control gates 251 through 256 to turn on driver 240. This can create a relatively good current path through pillar 240p of a respective driver.

A voltage of zero volts (0V) can be applied to one or all of control gates 251 through 256 to turn off driver 240. However, in order to allow driver 240 to support a relatively higher breakdown voltage (e.g., a breakdown voltage BV of 30V or higher) at the area near portion 240d (e.g., drain side of pillar 240p) and at the area near portion 240s (e.g., source side of pillar 240p), voltages having different values in addition to a voltage of 0V can be applied to control gates 251 through 256 when driver 240 is placed in the off-state.

For example, during an erase operation to erase information from memory cells 210, 211, 212, and 213 (FIG. 2), a relatively high voltage (e.g., Verase=30V) can be applied to data line 270 and line 299. This condition can increase the potential of pillar 240p (FIG. 5) to approximate the value of voltage Verase. The increase may exceed the breakdown voltage of driver 240 and cause damage to pillar 240p if control gates 251 through 256 are improperly controlled. As described below, the structure of driver 240 in FIG. 5 allows different sets of voltages to be applied to control gates 251 through 256 in order to reduce charging capacitance (e.g., gate-to-channel capacitance) during a write (program) operation of memory device 200 to provide support for a relatively high (e.g., 30V or higher) breakdown voltage, and provide an improved current (e.g., Ion) drive through pillar 240p of driver 240.

As an example, during a write operation of memory device 200, control gates 251 through 256 can be applied with voltages having values (e.g., in sequentially decreasing values from control gate 251 to 256) of 10V, 8V, 4V, 0V, 0V, and 0V, respectively. In another example, during an erase operation of memory device 200, control gates 251 through 256 can be applied with voltages having values (e.g., in a sequentially increasing values from control gate 251 to 256) of 0V, 0V, 9V, 16V, 23V, and 30 volts, respectively.

Thus, in a write operation the control gate (e.g., control gate 251 at the drain side of pillar 240p) that is closest to conductive region 240v (e.g., global word line side) can be applied with a higher voltage (e.g., 10V) than the voltage (e.g., 0V) applied to the control gate (e.g., control gate 256 at the source side pillar 240p) that is closest to conductive contact 223c (e.g., local word line side).

The structure of driver 240 allows it to have improvements and benefits over some conventional drivers. For example, some conventional drivers may have a multi-gate structure. However, in such a structure, the gates of the conventional driver may be biased at relatively high voltage value at the gate at the edges and a lower voltage value for the gates toward the center in order to support a relatively high breakdown voltage (e.g., drain side breakdown voltage of 30V or higher). Such a bias scheme in the conventional driver may cause the transistor controlled by the edge gates to turn on, thereby increasing the total charging capacitance from unselected memory cell strings associated with the conventional driver. This may make peripheral circuitry more complex.

In driver 240 of FIG. 5, the inclusion of portion 240a (combined with other portions 240d, 240b, and 240s) of pillar 240p, may allow reduction in the value of the voltage (e.g., V0) applied to the control gate (e.g., drain side edge control gate) closest to conductive region 240v (e.g., global word line side). For example, a voltage of approximately 10V (e.g., instead of 30V) can be applied to control gate 251 (as also described above) during a write operation of memory device 200. This relatively lower voltage (in comparison with the voltage applied to the edge gate of some conventional drivers) used in driver 240 can help weakly or strongly turn off the transistor control by the edge control gate, thereby reducing the total charging capacitance.

Further, during an erase operation of memory device 200, the total charging capacitance may have a relatively small impact in the operation of driver 240. Therefore, a relatively high voltage (e.g., 30V) can be applied to the control gate (e.g., source side edge control gate) closest to conductive contact 223c (e.g., local word line side). This allows driver 240 to have an improved current (e.g., Ion) drive Moreover, as described above, instead of a relatively lightly doped polysilicon, portion 240a can have an alternative structure, such as a silicon-like structure. Such an alternative structure can allow driver 240 to achieve a higher breakdown voltage (relative to the improved breakdown voltage supported by driver 240) and higher current (e.g., Ion) drive because of fewer defects, larger grains, or both, that the alternative structure (e.g., silicon-like structure) may provide.

Figure 6:
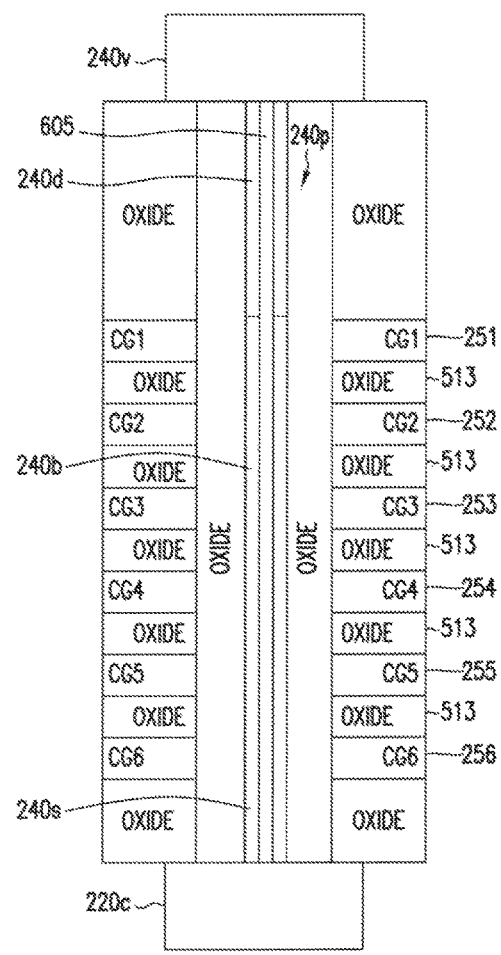
FIG. 6 shows a structure of a portion of a driver, which can be a variation of the driver of FIG. 5, according to some embodiments described herein.

FIG. 6 shows a structure of a portion of a driver 640, which can be a variation of driver 240 of FIG. 5, according to some embodiments described herein. Driver 640 can include elements similar to, or identical to, the elements of driver 240 of FIG. 5. Thus, for simplicity, similar or identical elements between drivers 240 and 640 are given the same reference labels and the descriptions of such elements are not repeated.

Differences between drivers 240 and 640 include the inclusion of a dielectric material 605 located in the middle of pillar 640 in FIG. 6. Dielectric material 605 can be surrounded by portions 240d, 240a, 240b, and 240s of pillar 240p. Dielectric material 605 can include silicon dioxide or other dielectric materials. In comparison with some conventional drivers, driver 640 can include improvements and benefits similar to the improvements and benefits provided by driver 240 described above with reference to FIG. 5.

Figure 7:
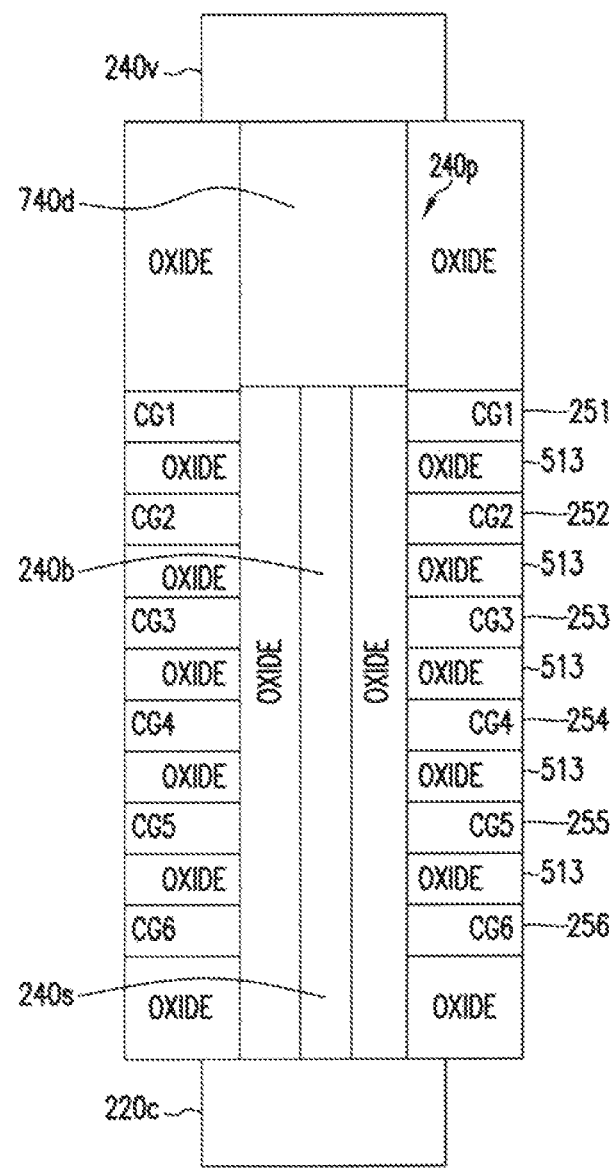
FIG. 7 shows a structure of a portion of a driver, which can be another variation of driver of FIG. 5, according to some embodiments described herein.

FIG. 7 shows a structure of a portion of a driver 740, which can be a variation of driver 240 of FIG. 5, according to some embodiments described herein. Driver 740 can include elements similar to, or identical to, the elements of driver 240 of FIG. 5. Thus, for simplicity, similar or identical elements between drivers 240 and 740 are given the same reference labels and the descriptions of such elements are not repeated.

Differences between drivers 240 and 740 include the inclusion of a portion 740d that can replace portions 240d and 240a and portions of dielectric material (e.g., silicon dioxide) adjacent portions 240d and 240a of FIG. 5. Portion 740d can include silicon dioxide or other dielectric materials. In comparison with some conventional drivers, driver 740 can include improvements and benefits similar to the improvements and benefits provided by driver 240 described above with reference to FIG. 5.

Figure 8:
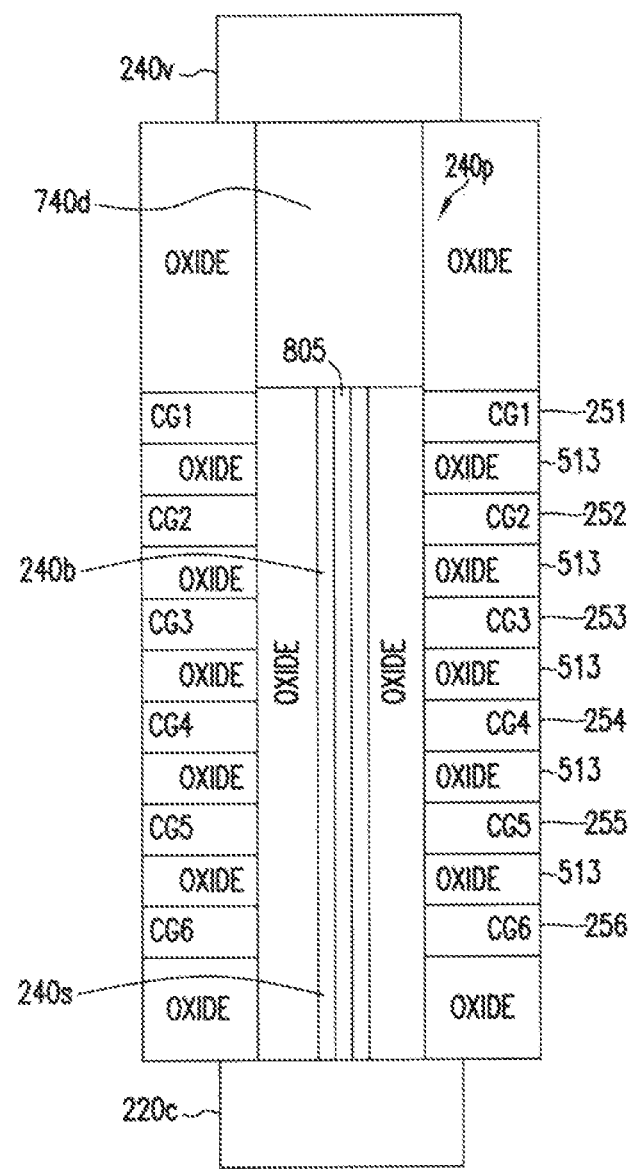
FIG. 8 shows a structure of a portion of a driver, which can be a variation of the driver of FIG. 7, according to some embodiments described herein.

FIG. 8 shows a structure of a portion of a driver 840, which can be a variation of driver 740 of FIG. 7, according to some embodiments described herein. Driver 840 can include elements similar to, or identical to, the elements of driver 740 of FIG. 7. Thus, for simplicity, similar or identical elements between drivers 740 and 840 are given the same reference labels and the descriptions of such elements are not repeated.

Difference between drivers 740 and 840 include the inclusion of dielectric material 805 located in the middle of pillar 640 and below portion 740d. Dielectric material 805 can be surrounded by portions 240b and 240s of pillar 240p. Dielectric material 805 can include silicon dioxide or other dielectric materials. In comparisons to some conventional drivers, driver 840 can include improvements and benefits similar to the improvements and benefits provided by driver 240 described above with reference to FIG. 5.

The illustrations of apparatuses (e.g., memory devices 100 and 200) and methods (e.g., operating methods associated with memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., a computer, a cellular phone, or other electronic systems) that includes a device such as any of memory devices 100 and 200.

Any of the components described above with reference to FIG. 1 through FIG. 8 can be implemented in a number of ways, including simulation via software. Thus, apparatuses (e.g., memory devices 100 and 200 or part of each of these memory devices, including a control unit in these memory devices, such as control unit 118 (FIG. 1)) described above may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100 and 200 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses, and methods operating the apparatuses. Some of the apparatuses include a first group of conductive materials interleaved with a first group of dielectric materials, a first pillar extending through the first group of conductive materials and the first group of dielectric materials, memory cells located along the pillar, a conductive contact coupled to one of the conductive materials, and a second pillar extending through a second group of conductive materials and a second group of dielectric materials. The second pillar includes a first portion coupled to a conductive region, a second portion, and a third portion, and a fourth portion coupled to the conductive contact. The second portion is located between the first and third portions. The second portion has a doping concentration less than a doping concentration of each of the first and fourth portions. Other embodiments including additional apparatuses and methods are described.

In the detailed description and the claims, a list of items joined by the term "one of" can mean any of the listed items. For example, if items A and B are listed, then the phrase "one of A and B" means A only or B only. In another example, if items A, and C are listed, then the phrase "one of A, B and C" means A only; B only; or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only; B only; or A and B. In another example, if items A, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a conductive region located on a first level of the apparatus;
   a conductive contact located on a second level of the apparatus;
   a group of conductive materials interleaved with a group of dielectric materials, the group of conductive materials and the group of dielectric materials located in respective levels of the apparatus between the first and second levels;
a pillar coupled between the conductive region and the conductive contact, the pillar extending through the group of conductive materials and the group of dielectric materials, the pillar including polysilicon; and
an additional dielectric material extending through the group of conductive materials and the group of dielectric materials, the additional dielectric material being between the pillar and each of the group of conductive materials and the group of dielectric materials, and the additional dielectric material contacting the polysilicon material of the pillar and contacting the group of conductive materials and the group of dielectric materials.

2. The apparatus of claim 1, wherein the dielectric material is silicon dioxide.

3. The apparatus of claim 1, wherein the dielectric material is silicon nitride.

4. The apparatus of claim 1, wherein the dielectric material has a dielectric constant higher than the dielectric constant of silicon dioxide.

5. An apparatus comprising:
a conductive region located on a first level of the apparatus;
a conductive contact located on a second level of the apparatus;
a group of conductive materials interleaved with a group of dielectric materials, the group of conductive materials and the group of dielectric materials located in respective levels of the apparatus between the first and second levels;
a pillar coupled between the conductive region and the conductive contact, the pillar extending through the group of conductive materials and the group of dielectric materials, the pillar including polysilicon; and
an additional dielectric material extending through the group of conductive materials and the group of dielectric materials, the additional dielectric material being between the pillar and each of the group of conductive materials and the group of dielectric materials, and the additional dielectric material contacting the polysilicon material of the pillar, wherein the pillar includes a first portion, a second portion, and a third portion, and a fourth portion, the second and third portions located between the first and fourth portions, and the second portion located between the first and third portions, wherein:
the first portion is contacting the conductive region;
the fourth portion is contacting the conductive contact; and
the second portion has a doping concentration less than a doping concentration of each of the first and fourth portions.

6. The apparatus of claim 5, wherein the third portion has a doping concentration less than the concentration of the second portion.

7. The apparatus of claim 5, wherein the second portion is doped poly silicon.

8. The apparatus of claim 5, wherein the third portion is doped polysilicon.

9. The apparatus of claim 5, wherein the third portion is undoped poly silicon.

10. The apparatus of claim 5, wherein the first portion has a first length, the second portion has a second length, and the second length is greater than the first length.

11. The apparatus of claim 5, wherein second portion has a grain size greater than 150 nanometers.

12. The apparatus of claim 5, wherein the pillar includes a dielectric, and the polysilicon material of the pillar at the third portion surrounds the dielectric.

13. The apparatus of claim 12, wherein the dielectric is a first dielectric, the pillar includes a second dielectric, and the polysilicon material of the pillar at the second portion surrounds the second dielectric.

14. The apparatus of claim 13, wherein the pillar includes a third dielectric, and the polysilicon material of the pillar at the third portion surrounds the third dielectric.

15. An apparatus comprising:
a conductive region located on a first level of the apparatus;
a conductive contact located on a second level of the apparatus;
a group of conductive materials interleaved with a group of dielectric materials, the group of conductive materials and the group of dielectric materials located in respective levels of the apparatus between the first and second levels; and
a pillar extending through a second group of conductive materials and a second group of dielectric materials, the pillar including:
a first portion, a second portion, and a third portion, and a fourth portion, the second and third portions located between the first and fourth portions, and the second portion located between the first and third portions, wherein,
the first portion is coupled to a conductive region, and
the fourth portion is coupled to the conductive contact, and the second portion has a doping concentration less than a doping concentration of each of the first and fourth portions.

16. The apparatus of claim 15, wherein the first portion has a first length, the second portion has a second length, and the second length is greater than the first length.

17. The apparatus of claim 16, wherein the third portion has a doping concentration less than the concentration of the second portion.

18. An apparatus comprising:
a first group of conductive materials interleaved with a first group of dielectric materials;
a first pillar extending through the first group of conductive materials and the first group of dielectric materials;
memory cells located along the first pillar;
a conductive contact coupled to a conductive material of the first group of conductive materials;
a second pillar coupled to the conductive contact and a conductive region, the second pillar extending through a second group of conductive materials and a second group of dielectric material, the second pillar including polysilicon; and
an additional dielectric material extending through the second group of conductive materials and the second group of dielectric materials, the additional dielectric material being between the second pillar and each of the second group of conductive materials and the second group of dielectric material, and the additional dielectric material contacting the polysilicon material of the second pillar and contacting the second group of conductive materials and the second group of dielectric material.

19. An apparatus comprising:
a first group of conductive materials interleaved with a first group of dielectric materials;

a first pillar extending through the first group of conductive materials and the first group of dielectric materials;
memory cells located along the first pillar;
a conductive contact coupled to a conductive material of the first group of conductive materials;
a second pillar coupled to the conductive contact and a conductive region, the second pillar extending through a second group of conductive materials and a second group of dielectric material, the second pillar including polysilicon; and
an additional dielectric material extending through the second group of conductive materials and the second group of dielectric materials, the additional dielectric material being between the second pillar and each of the second group of conductive materials and the second group of dielectric materials, and the additional dielectric material contacting the polysilicon material of the second pillar, wherein the second pillar includes a first portion, a second portion, and a third portion, and a fourth portion, the second and third portions located between the first and fourth portions, and the second portion located between the first and third portions, wherein:
the first portion is contacting the conductive region;
the fourth portion is contacting the conductive contact; and
the second portion has a doping concentration less than a doping concentration of each of the first and fourth portions.

20. The apparatus of claim 19, wherein the third portion has a doping concentration less than the concentration of the second portion.

* * * * *